(12) United States Patent
Akaogi et al.

(10) Patent No.: US 6,201,753 B1
(45) Date of Patent: Mar. 13, 2001

(54) LATCHING CAM DATA IN A FLASH MEMORY DEVICE

(75) Inventors: Takao Akaogi, Cupertino; Kazuhiro Kurihara, Sunnyvale, both of CA (US)

(73) Assignees: Advanced Micro Devices, Inc., Sunnyvale, CA (US); Fujitsu Limited (JP)

( * ) Notice: Subject to any disclaimer, the term of this patent is extended or adjusted under 35 U.S.C. 154(b) by 0 days.

(21) Appl. No.: 09/421,142

(22) Filed: Oct. 19, 1999

(51) Int. Cl.[7] .................................................... G11C 7/00
(52) U.S. Cl. .................. 365/226; 365/189.05; 365/233.5
(58) Field of Search ..................................... 365/226, 229, 365/52, 233.5, 189.09, 194, 189.05

(56) References Cited

U.S. PATENT DOCUMENTS

| | | | |
|---|---|---|---|
| 5,113,373 | * 5/1992 | Lee | 365/227 |
| 5,138,575 | * 8/1992 | Ema et al. | 365/185 |
| 5,197,034 | * 3/1993 | Fandrich et al. | 365/227 |
| 5,243,575 | * 9/1993 | Sambandan et al. | 365/233.5 |
| 5,263,000 | 11/1993 | Buskirk et al. | 365/226 |
| 5,267,213 | * 11/1993 | Sung et al. | 365/226 |
| 5,291,446 | 3/1994 | Buskirk et al. | 365/189.09 |
| 5,612,921 | 3/1997 | Chang et al. | 365/226 |
| 5,708,387 | 1/1998 | Cleveland et al. | 327/536 |
| 5,835,440 | * 11/1998 | Manning | 365/230.06 |
| 5,847,998 | 12/1998 | Buskirk | 365/185.33 |
| 5,867,430 | 2/1999 | Chen et al. | 365/189.04 |
| 5,995,415 | 11/1999 | Kuo et al. | 365/185.11 |
| 6,026,049 | * 2/2000 | Park | 365/233 |
| 6,033,955 | 3/2000 | Kuo et al. | 438/257 |

OTHER PUBLICATIONS

Brian Dipert and Markus Levy "Designing with Flash Memory—The definitive guide to designing flash memory hardware and software for components and PCMCIA cards", Annabooks, ISBN 0–929392–17–5, Ch. 3, pp. 23–44.

AMD, Technology Background brochure, "3.0 Volt–only Page Mode Flash Memory Technology."

AMD, Technology Background brochure, "3.0 Volt–only Burst Mode Flash Memory Technology."

AMD, Technology Background brochure, "1.8 Volt–only Flash Memory Technology."

AMD, Technology Background brochure, "AMD DL160 and DL320 Series Flash: New Densities, New Features."

Intel Corporation, "Common Flash Memory Interface Specification", Release 1.1, May 30, 1997.

AMD, "Common Flash Memory Interface Publication 100—Vendor & Device ID Code Assignments", Jul. 25, 1996, vol. 96.1.

AMD "Am29DL162C/AM29DL163C 16 Megabit (2 M x 8–Bit/1 M x 16–Bit) CMOS 3.0 Volt–only, Simultaneous Operation Flash Memory", Publication 21533, Rev: C Amendment/+2, Jul. 14, 1999.

Intel Corporation, "1.8 Volt Intel® Dual–Plane Flash Memory 28F320D18 (+16)", Product Review Datasheet, Order Number: 290672–002, Oct. 1999.

(List continued on next page.)

*Primary Examiner*—David Nelms
*Assistant Examiner*—Thong Le
(74) *Attorney, Agent, or Firm*—Brinks Hofer Gilson & Lione (57) ABSTRACT

A content addressable memory (CAM) circuit (200) is used as a data storage circuit to store information about operational mode and timing in a flash memory chip (100). To minimize current drain in a standby mode, the CAM circuit is placed in a low power state. To prevent unwanted switching of the output node (240) and eliminate excess current drain and mode switching of other circuits in the flash memory chip, the output of the CAM circuit is latched.

11 Claims, 5 Drawing Sheets

OTHER PUBLICATIONS

Macronix International Co., Ltd. "MXIC Advance Information MX29VW160T/B—16M–BIT [2M × 8–BIT/1M × 16–BIT] Simultaneous Read/Write Single 2.5V Operation Flash Memory", P/N:PM0567, Rev. 0.8, May 17, 1999.

Atmel Corporation, "Atmel® 16–megabit (1M×16/2M×8) 3–volt Only Flash Memory", Rev. 0925H–08/99.

STMicroelectronics, "M59DR032A, M59DR032B, 32Mbit (2Mb × 16, Dual Bank, Page) Low Voltage Flash Memory", preliminary data, 10/1999, pp. 1–38.

"AMD—Simultaneous Read/Write", obtained at the internet address http://www.amd.com/products/nvd/overview/flash_intro.html, Apr. 14, 1999.

"AMD—Simultaneous Read/Write", obtained at the internet address http://www.amd.com/products/nvd/overview/simuintro.html. Jul. 12, 1999.

"AMD News Release #9879", obtained at the internet address http://www.amd.com/news/prodpr/9879.html.

"Intel® 1.8 Volt Dual–Plane 32–Mbit Flash Memory (D18)", obtained at the internet address http://www.intel.com/design/flcomp/prodbref/298131.htm, Nov. 18, 1999.

U.S. Patent application, Ser. No. 09/159,459, filed Sep. 23, 1998.

\* cited by examiner-

| | Vg | Vd | Vs | PDB |
|---|---|---|---|---|
| PGM | ~8v | ~5v | 0v | 0v |
| ERASE | ~-9v | 0v | ~5v | 0v |
| READ(ACTIVE) | ~2.5v | 0v | 0v | ~1.5v |
| READ(STAND BY) | 0v | 0v | 0v | 0v |

LATCHING CAM DATA IN A FLASH MEMORY DEVICE

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention is directed to the field of non-volatile memories. More particularly, this invention relates to a non-volatile flash memory array with an arrangement that enables simultaneous read and write operations.

BACKGROUND

Computers, personal digital assistants, cellular telephones and other electronic systems and devices typically include processors and memory. The memory is used to store instructions (typically in the form of computer programs) to be executed and/or data to be operated on by the processors to achieve the functionality of the device. In some applications, the systems and devices may require that the instructions and/or data be retained in some form of a permanent/non-volatile storage medium so that the information is not lost when the device is turned off or power is removed. Exemplary applications include computer BIOS storage and diskless handheld computing devices such as personal digital assistants.

One way to provide such non-volatile storage capability is to include a mass-storage device such as a hard disk drive. Hard disk drives are mechanical devices which store data on rotating magnetic platters. However, such devices may be difficult to fit in small systems and may have significant reliability, cost and manufacturing constraints. An alternative to such devices is integrated circuit based non-volatile memories. One type of non-volatile memory that can be used is Erasable Programmable Read Only Memory ("EPROM"). While conventional EPROM's provide reliable non-volatile storage, they may not be able to be reprogrammed in the field in a practical manner. For example, EPROM's typically require exposure to ultraviolet light to erase them which may require that the EPROM memory chips be removed from the device. Once erased and reprogrammed, they are placed back in the device. In many applications, removing the memory to reprogram the device is not practical. In addition, besides not being easily reprogrammed, EPROM's may not have satisfactory data storage densities.

To avoid the complexity of EPROM's and to provide a device that can be reprogrammed in the field, many electronic designs use Electrically Erasable Programmable Read Only Memory ("EEPROM"), Static Random Access Memory ("SRAM") or flash memory, which can be reprogrammed electrically and without special hardware. SRAM is not technically a form of non-volatile memory but can be used in some applications requiring non-volatile capability.

EEPROM has the disadvantages of being expensive and having a very limited life cycle, i.e. an EEPROM can only be erased and rewritten a limited number of times before the device becomes non-functional. SRAM offers high operating speeds but only maintains its contents as long as power is supplied, therefore requiring a battery or other power source. This necessitates additional hardware to maintain power to the SRAM to preserve the stored contents, which increases manufacturing cost and complexity. Further, the additional hardware may put undesirable constraints on the physical size of the design. In addition, EEPROM's and SRAM's may not have as high a data storage density as compared to other forms of storage. Therefore, where cost, size or density is a factor, flash memories are preferred because they may be simpler to reprogram in the field then EPROM's, less expensive than EEPROM's, easier to implement than battery-backed SRAM's and available in higher data storage densities.

Flash memory (or flash RAM) is a form of non-volatile storage which uses a memory cell design with a floating gate. High voltages are applied to the memory cell inputs to program/store charge on the floating gate or to erase/remove charge from the floating gate. Programming occurs by hot electron transfer to place charge on the floating gate while erasure makes use of Fowler-Nordheim tunneling in which electrons pierce through a thin dielectric material, reducing the amount of electronic charge on the floating gate. Erasing a cell sets the logical value of the cell to "1" while programming the cell sets the logical value to "0". Aside from programming or erasing operations, a flash memory operates similarly to a randomly accessible read only memory (ROM). Conventionally, a flash memory chip, including the flash memory storage cells and support logic/circuitry, is made by fabricating layers of semiconductor material and interconnect layers of polysilicon and first and second metal layers onto a substrate. It will be appreciated that there are numerous integrated circuit fabrication techniques, involving more or fewer layers, which are applicable herein.

Prior flash memories could only be erased by erasing the entire memory chip also known as bulk erasure. Byte by byte erasure was not possible. To somewhat alleviate this problem, modern flash memory is typically divided logically into blocks called "sectors" where each sector contains a portion of the total bytes of data storage available. For example, a typical flash memory may have 32 megabits of total storage and be logically broken down into 64 sectors, each sector containing 64 Kilobytes of data (one byte being equal to eight bits). This arrangement allows for the option of erasure of one sector at a time in addition to bulk erasure of the entire memory. While typical flash memories are still incapable of byte by byte erasure, data in the flash memory may still be programmed byte by byte (or sometimes word by word, where a word equals four bytes) depending on the implementation. It will be appreciated that the granularity by which a flash memory device can be programmed or erased may vary and that granularities down to bit level programming/erasure are contemplated.

In order to program and/or erase a flash memory, typically a complex process must be followed. For example, before erasing a particular sector, that sector must be programmed (known as "pre-programming"). These steps of erasing and programming involve complex application of high voltages to the memory cells for specified periods of time and in particular sequences. Many flash memories provide embedded state machines which perform the complex programming and erasing operations automatically. These processes of programming and erasing a flash memory may take a long time to complete. A typical erase sequence can take anywhere from 0.7 seconds up to 15 seconds. To erase an entire chip can take up to 49 seconds. While programming is much faster, on the order of 7 to 300 microseconds, it is still slow compared to other memory devices. Programming an entire chip can take up to 7 seconds (including the time to verify the data). Typically, standard Dynamic Random Access Memory ("DRAM") offers access times on the order of nano-seconds, a difference between microseconds of many orders of magnitude.

This complex nature of programming and erasing flash memory devices leads to a major problem in that they do not provide sufficiently fast random access. For example, conventional flash memory devices typically do not allow a processor to perform a read operation while a program or erase operation is underway in the flash memory device. In most implementations, the processor is required to periodically poll a status register of the flash memory device to detect the end of the program or erase operation before initiating a read operation to the flash memory device.

Unfortunately, as noted above, the programming and erase cycle times for typical flash memory devices are orders of magnitude greater than acceptable write access times of a conventional random access main memory using, for example, Dynamic Random Access Memory ("DRAM"). Such long latencies associated with programming or erase operations can lock up the operating system and prevent the system from functioning for unacceptably long time intervals if the flash memory is the only memory in the electronic system. Some prior flash memories allow erase suspend operations in order to address this problem. Erase suspend allows the processor to pause an erase operation so another sector can be read. However, such memories typically still impose a suspend latency interval of several microseconds before a read operation can be initiated. A typical suspend latency interval is from 0.1 to 20 microseconds.

Prior systems may employ multiple flash memory devices in an attempt to prevent such operating system lock up. In such systems, the processor usually has read access to one of the flash memory devices while other flash memory devices are undergoing a program or erase operation. However, such systems typically suffer from high costs because multiple flash memory devices are implemented even though the capacity of a single flash memory device may accommodate the needs of the particular electronic device.

Another prior art system uses a flash memory in combination with an EEPROM memory. This system allows a read operation of one of the memories while writing to the other. However, the size of an EEPROM memory cell is significantly larger than that of a flash memory cell which reduces the amount of storage that can be placed on the memory chip. Further, there are significant design and manufacturing complexities involved with integrating two different memory technologies on the same chip. Therefore, a device which uses an EEPROM in combination with a flash memory will typically be more expensive both to design and manufacture.

In addition, programming and erasing a flash memory involves higher than normal voltages as compared to performing read operations. The use of these higher than normal voltages can cause problems when trying to implement the capability to simultaneously read while programming/erasing. Such problems include difficulties in distributing the high voltages required for the program and erase operations along with normal voltage for read operations and handling increased noise induced on the read sense outputs by the use of high voltages elsewhere within the device. Further, depending on the implementation, redundant logic may also be employed which introduces further complexities.

Accordingly, there is a need for an efficiently designed and manufacturable flash memory device that allows simultaneous read and write operations.

SUMMARY OF THE INVENTION

The present invention is defined by the following claims, and nothing in this section should be taken as a limitation on those claims. By way of introduction, the preferred embodiments described below relate to reducing switching of output signals from data storage circuits such as content addressable memories storing operational mode and timing information in a circuit such as a flash memory. The output of the data storage circuit is latched during power down operations to prevent unwanted mode changes and current flow.

DETAILED DESCRIPTION OF THE PRESENTLY PREFERRED EMBODIMENTS

Herein, the phrase "coupled with" is defined to mean directly connected to or indirectly connected with through one or more intermediate components. Referring now to the Figures and in particular, FIG. 1, there is schematically shown a flash memory device 100 according to the present invention that provides for reading while simultaneously undergoing a program or erase operation. The memory device 100 according to the present invention may include one or more components of the memory devices disclosed in U.S. Pat. No. 5,867,430 entitled "BANK ARCHITECTURE FOR A NON-VOLATILE MEMORY ENABLING SIMULTANEOUS READING AND WRITING," to Chen et al and U.S. Pat. No. 5,847,998 entitled "NON-VOLATILE MEMORY ARRAY THAT ENABLES SIMULTANEOUS READ AND WRITE OPERATIONS," to Van Buskirk, both of which are herein incorporated by reference and further describe the implementation and operation of a device of this type. The memory device 100 may also include one or more components of such exemplary flash memory devices capable of simultaneous read and write operation as the Am29DL162C and Am29DL163C 16 megabit ("Mb") flash memory chips and the Am29DL322C and Am29DL323C 32 Mb flash memory chips manufactured by Advanced Micro Devices, Inc. located in Sunnyvale, Calif. For more detail regarding these exemplary flash memory chips, refer to "Am29DL322C/Am29L323C 32 Megabit (4M×8-Bit/2M× 16-Bit) CMOS 3.0 Volt-only, Simultaneous Operation Flash Memory" Datasheet and "Am29DL162C/Am29L163C 16 Megabit (2M×8-Bit/1M×16-Bit) CMOS 3.0 Volt-only, Simultaneous Operation Flash Memory" Datasheet. While the exemplary devices disclosed above have capacities of 16 or 32 Mb, it will be appreciated that the embodiments disclosed herein are equally applicable to devices with higher bit densities such as 64 or 128 Mb devices.

In a typical embedded application of the above exemplary simultaneous operation capable flash memory 100, the available data storage space can be structured to store data and boot code in one bank and control code in another bank. The control code, which can contain command sequences which tell one bank, for example, bank 196, to program/erase data sectors, can reside as executable code in the alternate bank, for example bank 194. While the first bank is being programmed/erased, the system can continue to execute code from the alternate bank to manage other system operations. Similarly, depending on the system implementation, the CPU can also execute code from the first bank while the alternate bank undergoes a program/erase. There is no bank switching latency and no need to suspend the program/erase operation to perform the read. This minimizes the CPU's read/write cycle time, maximizes data throughput and reduces overall system cost by eliminating the need for additional hardware. It will be appreciated that while the exemplary devices have two banks of memory cells, devices with more than two banks are contemplated.

Figure 1:
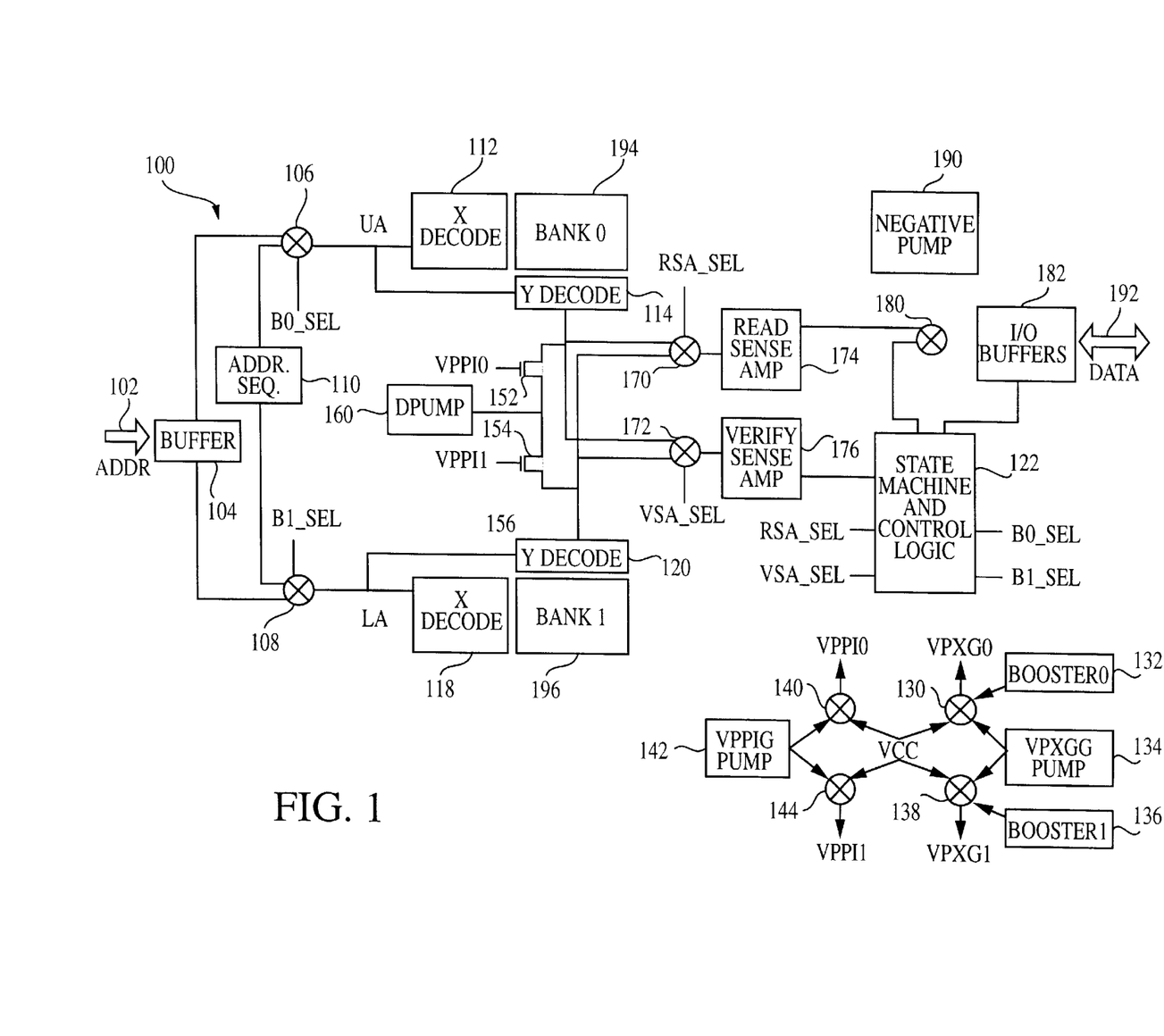
FIG. 1 depicts a block diagram of a flash memory chip according to the present invention that is capable of simultaneous reading and writing.

Again referring to FIG. 1, the memory device 100, according to an embodiment of the present invention, includes a 21 bit address input 102, a 16 bit data input/output ("DATA") 192, power inputs (not shown in FIG. 1) and control inputs (not shown in FIG. 1). The control inputs include Chip Enable, Output Enable, and Write Enable. The Chip Enable signal activates the chip's control logic and input/output buffers. When Chip Enable is not asserted, the memory device operates in standby mode. Output Enable is used to gate the outputs of the device through I/O buffers during read cycles. Write Enable is used to enable the write functions of the memory device. In one embodiment, all of the components of FIG. 1 are contained on a single integrated circuit chip. Note that address and control inputs for the exemplary flash memory chips are dependent on memory density and interface implementations. It will be appreciated that the disclosed embodiments can work with higher memory densities and alternate interface implementations with their accompanying alternate address and control input configurations.

The memory device 100 further includes address buffer 104, address multiplexers 106 and 108, address sequencer 110, X logical address decoders 112 and 118, Y logical address decoders 114 and 120, memory array Banks 0 and 1 denoted as 194 and 196 respectively, Dump 160, data multiplexers 170 and 172, read sense amplifiers 174, verify sense amplifiers 176, negative pump 190, output multiplexer 180, state machine and control logic 122, input/output buffers 182, VPPIG Pump 142, booster 0 denoted as 132, VPXGG Pump 134, booster 1 denoted as 136 and power multiplexers 130, 138, 140 and 144. The address input 102 is received by the address buffer 104, which sends the address to the address multiplexer 106 for bank 194 and the address multiplexer 108 for bank 196. The address sequencer 110 is controlled by the state machine and control logic 122. In one embodiment, the address sequencer 110 is part of the state machine and control logic 122. The output of the address sequencer 110 is an address which is sent to both multiplexer 106 and multiplexer 108. The address sequencer 110 is used to generate sequential addresses during an erase sequence. The output of the multiplexer 106, upper address UA, is communicated to the X address decoder 112 and the Y address decoder 114. The output of the multiplexer 108, lower address LA, is sent to the X address decoder 118 and the Y address decoder 120. The multiplexer 106 chooses between the address from the buffer 104 and the address from the address sequencer 110 in response to a control signal B0_SEL. The multiplexer 108 chooses between the address from the address buffer 104 and the address from address sequencer 110 based on a control signal B1_SEL. The selection signals B0_SEL and B1_SEL are generated by the state machine and control logic 122.

Bank 194 and bank 196 are arrays (or sets) of flash memory cells (operation of these individual flash memory cells is discussed in more detail below). The banks 194, 196 are organized by words and then by sectors and can either be byte or word addressable. It will be appreciated by those skilled in the art that other types of non-volatile memory are also within the scope of the present invention. The address decode logic for bank 194 includes the X address decoder 112 and the Y address decoder 114. The X address decoder 112 includes a word line decoder and sector decoder. The word line decoder receives address bits UA[6:14] and the sector decoder receives address bits UA[15:18]. The Y address decoder 114 includes a bit line decoder and Y bit line gating. The bit line decoder receives address bits UA[0:5].

The address decode logic for bank 196 includes the X address decoder 118 and the Y address decoder 120. The X address decoder 118 includes a word line decoder and a sector decoder. The word decoder receives address bits LA[6:14] and the sector decoder receives address bits LA[15:18]. The Y address decoder 120 includes a bit line decoder and Y bit line gating. The bit line decoder receives address bits LA[0:5]. In one embodiment, the address buffer 104 includes a latch to store the address being decoded. In another embodiment, the latch can be part of the decoders 112, 114, 118, 120.

FIG. 1 further shows a multiplexer 130 with three inputs: booster zero 132, VPXGG pump 134 and VCC. The VPXGG pump 134 is a positive power supply for generating and supplying a regulated positive potential to the control gate of selected flash memory cells via the word lines. Many different voltage pumps known in the art are suitable for use in the present invention. A more detailed explanation of one technology which can be included in VPXGG pump 134 can be found in U.S. Pat. No. 5,291,446, "VPP POWER SUPPLY HAVING A REGULATOR CIRCUIT FOR CONTROLLING A REGULATED POSITIVE POTENTIAL" to Van Buskirk et al, the entire contents of which are incorporated herein by reference. Booster 132 is used to boost the word line during reads. The multiplexer 130 receives a selection signal from state machine and control logic 122 and chooses one of its three inputs to send to the word lines of bank 194 via the X address decoder 112. The output of the multiplexer 130 is labeled as VPXG0. FIG. 1 is drawn to show the three inputs 132, 134 and VCC connected to a multiplexer in order to simplify the disclosure. A more detailed description of one exemplary implementation can be found in U.S. Pat. No. 5,708,387, "FAST 3-STATE BOOSTER CIRCUIT", to Cleveland et al, the entire contents of which are incorporated herein by reference. Many booster circuits and selection circuits known in the art are suitable for use in the present invention.

FIG. 1 also includes another multiplexer 138 having three inputs: booster one denoted as 136, VPXGG pump 134 and VCC. Booster 136 is similar to booster 132. The multiplexer 138 operates in a similar fashion to multiplexer 130, and receives its selection signal from the state machine and control logic 122. The output of multiplexer 138 is VPXG1 which is sent to the word lines of bank 196 via the X address decoder 118. The purpose of the multiplexers 130 and 138 is to switch between the three power lines depending on the operation being performed on the particular bank of memory cells.

The VPPIG pump 142 is a high voltage pump used to pass high voltage to the drain of the memory cells. The output of the VPPIG pump 142 is sent to multiplexer 140 and multiplexer 144. Both multiplexers also have VCC as an input. Multiplexers 140 and 144 switch between inputs based on signals and from the state machine and control logic 122. The output of multiplexer 140 is VPPI0 and the output of multiplexer 144 is VPPI1. During a normal read operation, VPPI1 and VPPI0 are connected to VCC. VPPI0 is connected to the gate of an N-channel transistor 152. VPPI1 is connected to the gate of an N-channel transistor 154. The source of transistor 152 is connected to Y address decoder 114, multiplexer 170 and multiplexer 172. The drain of transistor 152 is connected to the Dpump 160 and the drain of transistor 154. The Dpump 160 is a drain power supply. Various drain power supplies, known in the art, can be used for the present invention. One exemplary drain pump is disclosed in U.S. Pat. No. 5,263,000, "DRAIN POWER SUPPLY", to Van Buskirk, et al., the entire contents of which are incorporated herein by reference. The source of transistor 154 is connected to multiplexer 170 and multiplexer 172. The source of transistor 154 is also connected to Y address decoder 120 for purposes of accessing the bit lines in bank 196. The connections to multiplexers 170 and 172 provide a path for reading data from bank 194 and bank 196. Multiplexer 170 uses the signal RSA_SEL from the state machine and control logic 122 to selectively choose one of the two input signals to communicate to the read sense amplifiers 174. Multiplexer 172 uses the selection signal VSA_SEL from the state machine and control logic 122 in order to selectively communicate one of its two input signals to the verify sense amplifiers 176. Thus, the two transistors (152 and 154) and the two multiplexers (170 and 172), are used to selectively pass voltages to the drains of selected cells in bank 194 or bank 196 and to selectively read data from either bank 194 or bank 196.

Data from either bank 194 or bank 196 can be communicated to either the read sense amplifiers 174 or the verify sense amplifiers 176. Both sense amplifiers are in communication with the state machine and control logic 122. While data from bank 194 is communicated to the read sense amplifiers 174, data from bank 196 can be communicated to the verify sense amplifiers 176. While data from bank 194 is communicated to the verify sense amplifiers 176, data from bank 196 can be communicated to the read sense amplifiers 174. The output of the verify sense amplifiers 176 is sent to the state machine and control logic 122, which is used to verify that a particular byte has been programmed or erased. Note that in the memory device 100, the preferred implementation of the read sense amplifiers 174 provides two sets of sense amplifiers, one for each bank 194, 196. Only the sense amplifiers for the bank 194 or 196 undergoing a read operation are active during the read operation. The verify sense amplifiers 176 of the memory device 100 also have two sets of verify amplifiers, one for each bank.

Data from the read sense amplifiers 174 is sent to multiplexer 180. A second input of the multiplexer 180 includes device 100 status information from the state machine and control logic 122 such as whether or not a program or erase is in progress. The selection signal for multiplexer 180 is provided by the state machine and control logic 122.

I/0 buffers 182 are used to pass data out and receive data into memory device 100. While a read is being performed on one of the banks, multiplexer 180 will communicate output data from read sense amplifiers 174 to I/O buffers 182. During an erase or program sequence, multiplexer 180 will communicate status information to I/O buffers 182 so that an outside processor can poll the memory device 100 for the status in regard to the erase or program.

The memory device 100 also includes a negative pump 190 that is used to generate a relatively high negative voltage to the control gates of selected memory cells via the word lines of either bank 194 or bank 196, as selected by the state machine and control logic 122. The negative pump 190 is in communication with the X address decoders 112 and 118. One example of a negative pump can be found in U.S. Pat. No. 5,612,921, "LOW SUPPLY VOLTAGE NEGATIVE CHARGE PUMP", to Chang et al, the entire contents of which are incorporated herein by reference.

The state machine and control logic 122 provides the control for read, program and erase operations. Many of the selection lines used to select between bank 194 and bank 196 are controlled by the state machine and control logic 122. Alternatively, the output from the X and Y address decoders 112, 114, 118, 120 can be used to select between banks of memory cells.

The memory device 100 is programmed using an embedded programming sequence and is erased using an embedded erase sequence. The embedded sequences allow a processor to initiate a program or erase sequence and perform other tasks while the program and erase sequences are being carried out. The embedded program and erase sequences are controlled by the state machine and control logic 122, which uses a command register to manage the commencement of either sequence. The erase and programming operations are only accessed via the command register which controls an internal state machine that manages device operations. Commands are written to the command register via the data inputs 192 to the memory device 100.

While one bank is being programmed, the other bank can be accessed for a read operation. For example, during a program of a byte in bank 196, the state machine and control logic 122 would cause multiplexer 108 to select the address from buffer 104 for communication to decoders 118 and 120. Further, the state machine and control logic 122 would store the data byte to be programmed from the I/O buffers 182 for verification when the programming completes. The output of bank 196 would be sent to the verify sense amplifiers 176 via multiplexer 172 for comparison with the stored input data. During a simultaneously initiated read operation to bank 194, the state machine and control logic 122, after storing away the data to be programmed, instructs multiplexer 106 to select the address from the buffer 104 for communication to the X and Y address decoders 112 and 114. The output of bank 194 would be sent to the read sense amplifiers 174 via multiplexer 170. The output of the read sense amplifiers 174 would be sent, via multiplexer 180, to the 110 buffers 182 and then to the data bus 192.

Similarly, during an erase of a sector in bank 194, the state machine and control logic 122 would cause multiplexer 106 to select the addresses from the address sequencer 110. The address sequencer 110 would be used to cycle through all the bytes in a particular sector to make sure that each byte is preprogrammed. The sector is subsequently bulk erased. After erasure, the address sequencer 110 would be used to generate addresses to verify each byte of this erased sector. While bank 194 is being erased and multiplexer 106 is selecting an address from the address sequencer 110, a read operation can be carried out in bank 196 by using multiplexer 108 to select the address from the buffer 104 rather than an address from address sequencer 110. During the verify operation of the erase method for bank 194, the state machine and control logic 122 would be verifying the data using the verify sense amplifiers 176, while read data from bank 196 would be communicated to the read sense amplifiers 174. Thus, each bank has two input address paths and two output data paths that can be multiplexed so that either bank can be read from while the other bank is simultaneously being written to.

A typical flash memory cell, used within the banks 194 or 196, includes a nor-type floating gate transistor although it will be appreciated by those skilled in the art that there are many ways to implement a flash memory cell and that the configurations and operating characteristics may vary. It will further be appreciated that the embodiments disclosed herein are generally applicable and not limited to one particular implementation of a flash memory cell. The exemplary transistor has three connections called the source, drain and control gate. In a typical flash memory array, the control gates of the memory cells are connected to the word lines of the array which are used to address the data stored in the array. The drains are connected to the bit lines which are selectively connected to the chip power supply (Vcc) depending on which bits are to be read. The sources are used to sense/read the stored data out of the array.

During an erase operation, the source input of the memory cell transistor is grounded, the drain/bit line is left to float and the control gate/word line is connected to a relatively high negative voltage supplied by the negative pump 190. The typical high negative voltage applied to the control gate/word line by the negative pump 190 is approximately minus 9.5 volts although other voltages and input combinations can be used. Based on this input configuration, any charge stored on the floating gate of the memory cell transistor will discharge by flowing out to the source due to Fowler-Nordheim Tunneling.

During a program operation, the source input of the memory cell transistor is connected to ground, the drain/bit line is connected to a high positive voltage provided by the VPPIG Dpump drain power supply 142 and the control gate/word line is connected to a high voltage provided by the VPXGG pump positive power supply 134. The typical high voltage applied to the drain by the VPPIG 142 is approximately 6 Volts while the typical high voltage applied to the control gate by the VPXGG 134 pump is approximately 12 Volts. It will be appreciated by those skilled in the art that other voltage and input combinations can also be used. Based on this input configuration, charge will flow by hot electron transfer to the floating gate of the memory cell transistor and accumulate there.

While programming and erasing the memory cell require higher than normal voltages, reading from the cell only requires the availability of the normal supply voltage. To read from the memory cell, the source is connected to Vcc (the chip supply voltage) and the control gate/word line are connected to the booster power supplies 132, 136. The current value of the memory cell is sensed from the drain/bit line connection. There is a booster power supply 132 for bank 194 and a booster power supply 136 for bank 196. The booster power supplies 132, 136 are used to boost the word lines of bank 194 or bank 196 during a read operation. The typical Vcc supply voltage is 3.0 Volts although other supply voltages are known in the art. The typical booster voltage is 5.0 Volts, although the use of the other voltages on the control gate for read operations is generally known. If there is charge stored on the floating gate, i.e. the memory cell has been programmed, the flow of current from the source to the drain will be inhibited and the memory cell will read as a logical "0". If the memory cell has been erased, there will be no charge stored on the floating gate and with Vcc applied to the control gate, current will flow from the source to the drain and the memory cell will read as a logical "1".

Application of the particular voltages necessary for each operation is handled by the state machine and control logic 122. This logic 122 controls the multiplexers 130, 138, 140, 144 that place the proper voltages from the various power supplies 132, 134, 136, 142 and VCC on the memory cell inputs depending on the desired function.

While the total capacity of the simultaneous read and write capable flash memory device 100 is 16 or 32 MB or higher, how that capacity is distributed among the available banks is variable. Users of simultaneous read and write capable flash memory may need different bank partition sizes depending on their applications. To meet the varying needs of users, the flash memory device 100 preferably implements a sliding bank architecture. This architecture allows the simplified design and manufacture of simultaneous flash memory devices with varied bank partition sizes. To alter the bank sizes, only a single metal layer of the chip needs to be altered. For a more detailed discussion of the sliding bank architecture, refer to U.S. Pat. No. 5,995,415 entitled "SIMULTANEOUS OPERATION FLASH MEMORY DEVICE WITH FLEXIBLE BANK PARTITION ARCHITECTURE", to Kuo et al. U.S. Pat. No. 6,033,955 entitled "METHOD OF MAKING FLEXIBLY PARTITIONED METAL LINE SEGMENTS FOR A SIMULTANEOUS OPERATION FLASH MEMORY DEVICE WITH A FLEXIBLE BANK PARTITION ARCHITECTURE", to Kuo et al. U.S. patent application Ser. No. 09/159,029, "METHOD OF MAKING FLEXIBLY PARTITIONED METAL LINE SEGMENTS FOR A SIMULTANEOUS OPERATION FLASH MEMORY WITH A FLEXIBLE BANK PARTITION ARCHITECTURE", filed Sep. 23, 1998 and U.S. patent application Ser. No. 09/159,489, "BANK SELECTOR CIRCUIT FOR A SIMULTANEOUS OPERATION FLASH MEMORY DEVICE WITH A FLEXIBLE BANK PARTITION ARCHITECTURE", filed Sep. 23, 1998, the entire contents of which are incorporated herein by reference. The sliding bank architecture enables many different devices to be produced with only a single mask change in one of the final steps of production. In the case where the flash memory device 100 has a capacity of 32 megabits (Mb), partitions where bank 194 has a capacity 4 or 8 Mb and bank 196 has a capacity of 28 or 24 Mb respectively, can be used. In the case where the flash memory device 100 has a capacity of 16 Mb, partitions where bank 194 has a capacity of 2 or 4 Mb and bank 196 has a capacity of 14 or 12 Mb respectively, can be used. This has the advantages that many different flash memory devices can share much of the same basic design, process and manufacturing expense.

Figure 2:
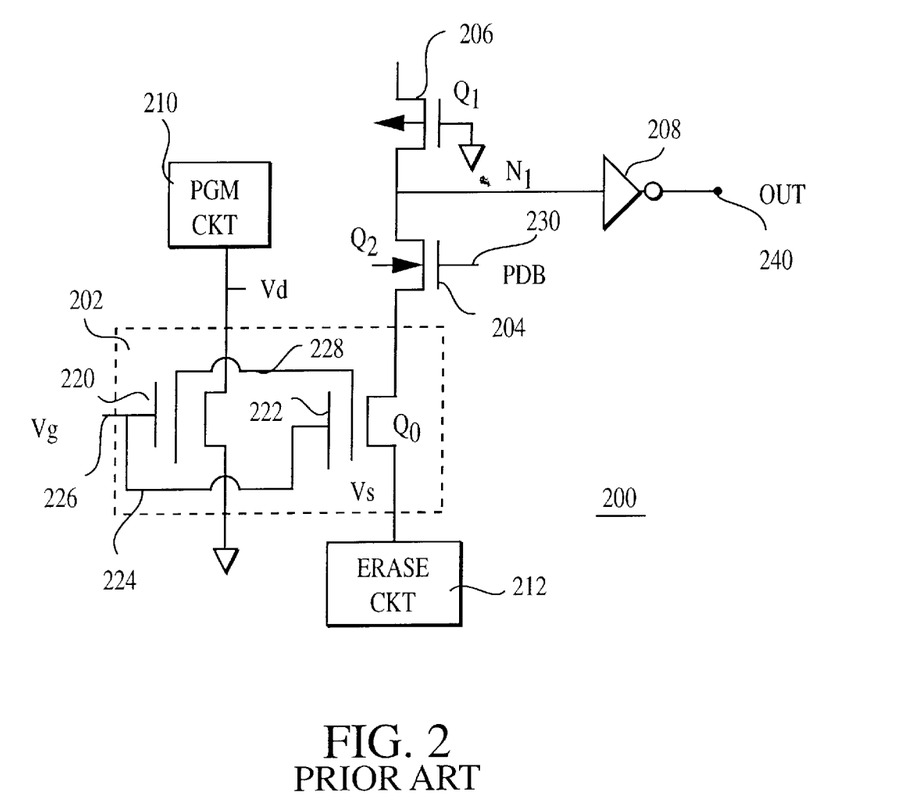
FIG. 2 depicts a prior art content addressable memory (CAM) circuit for storing operational and timing data in the flash memory chip of FIG. 1.

FIG. 2 is a prior art content addressable memory (CAM) circuit 200 for storing operational and timing data in the flash memory chip 100 of FIG. 1. The CAM circuit 200 includes a CAM cell 202, a switching transistor 204, a bias transistor 206 and an inverter 208. For controlling the data stored in the CAM cell 202, the CAM circuit 200 includes a program circuit 210 and an erase circuit 212. The CAM cell 202 includes a storage transistor 220 and an access transistor 222. The storage transistor 220 and the access transistor 222 have their gate terminals in common. In particular, the storage transistor 220 and the access transistor 222 have a control gate 224 coupled to a node 226 labeled Vg in FIG. 2. Further, the storage transistor 220 and the access transistor 222 each has a floating gate 228 which is not coupled externally to the CAM cell 202.

Figure 3:
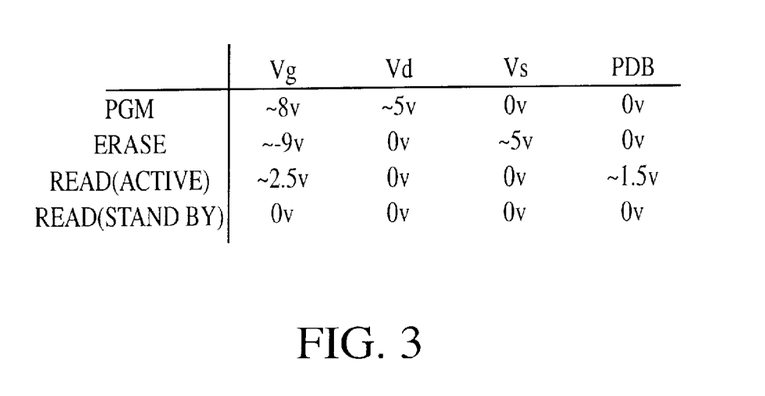
FIG. 3 is a table showing typical voltages for the different operational modes of the CAM circuit of FIG. 2.

By proper application of voltages using the program circuit 210, the erase circuit 212 and voltages applied to the gate terminal 226, charge may be stored on the floating gate 228 of the CAM cell 202. Similarly, charge may be removed from the floating gate 228 by suitable application of voltages. FIG. 3 is a table which illustrates suitable voltages for different modes of operation of the CAM circuit 200 of FIG. 2. FIG. 3 illustrates the approximate voltage necessary for a program mode (PGM) and for an erase mode (ERASE). Further, FIG. 3 illustrates voltages suitable for reading data in the CAM cell 202 during a read (active) mode or active mode and a read (standby) or standby mode. In the active mode, the CAM circuit 200 is actively operating to read previously stored data. In the standby mode, the CAM circuit 200 is operating in a low power mode of operation. Circuits suitable for generating the voltages illustrated in FIG. 3 may be readily designed by those ordinarily skilled in the art. Any suitable program circuit 210 or erase circuit 212 may be used to perform the functions described herein.

The switching transistor 204 is responsive to a power down signal received at a gate 230. The power down signal is labeled PDB in FIG. 2 to indicate that this is an active low signal. Since the switching transistor 204 is an n-channel transistor, when the power down signal is received at the gate 230, the switching transistor 204 is turned off, interrupting the flow of current in the circuit leg including the bias transistor 206, the switching transistor 204 and the sensing transistor 222. The bias transistor 206 is a p-channel transistor and has its gate grounded, so that this transistor is always turned on. Preferably, the bias transistor 206 is sized to operate as a weak pull-up transistor, biasing the node labeled N1 to a high voltage level unless the switching transistor 204 is turned on to pull the node N1 low. The inverter 208 inverts the logic level on the node N1 to provide the data state of the CAM cell 202 to the output 240.

The CAM circuit 200 including the CAM cell 202 operates as a switch or a data storage circuit for controlling an operational mode or timing of the flash memory chip 100 of FIG. 1. For example, data relating to timing delays may be stored in the CAM cell 202 for reading and subsequent use by other circuits of the flash memory chip 100. The signal produced at the output 240 is coupled to other circuitry of the flash memory chip 100 and is used for controlling the operational mode of the chip. The output signal may be read during initiation of operation or during a mode change. When the output signal at the output 240 switches, the mode of the chip will be changed. Further, other CMOS circuits of the flash memory chip 102 will switch when the output signal switches, causing current flow and power dissipation in these other circuits.

During the read (active) mode, if the CAM cell 202 is programmed, the output node 240 goes low because the CAM cell does not draw current. When programmed, the CAM cell transistor 222 remains turned off. Since there is no current in the leg including transistor 206, transistor 204, and transistor 222, transistor 206 operates as a pull-up and pulls the node N1 up to approximately Vcc. If the CAM cell 202 has been programmed, the access transistor 222 is turned on and the CAM cell 202 draws current. This pulls the node N1 low and the output and node 240 goes high.

During the read (standby) mode, the output node 240 always stays low, no matter what the data state of the CAM cell 202 is. In the standby mode, the power down signal is asserted at node 230, turning off the transistor 204. The pull-up transistor 206 pulls the node N1 high, so that the output node 240 remains low. The CAM cell and its data state are thus isolated from the output node 240. As a result, when the CAM cell 202 is unprogrammed, the output node 240 switches from high to low every time the operation mode goes to standby.

Figure 4:
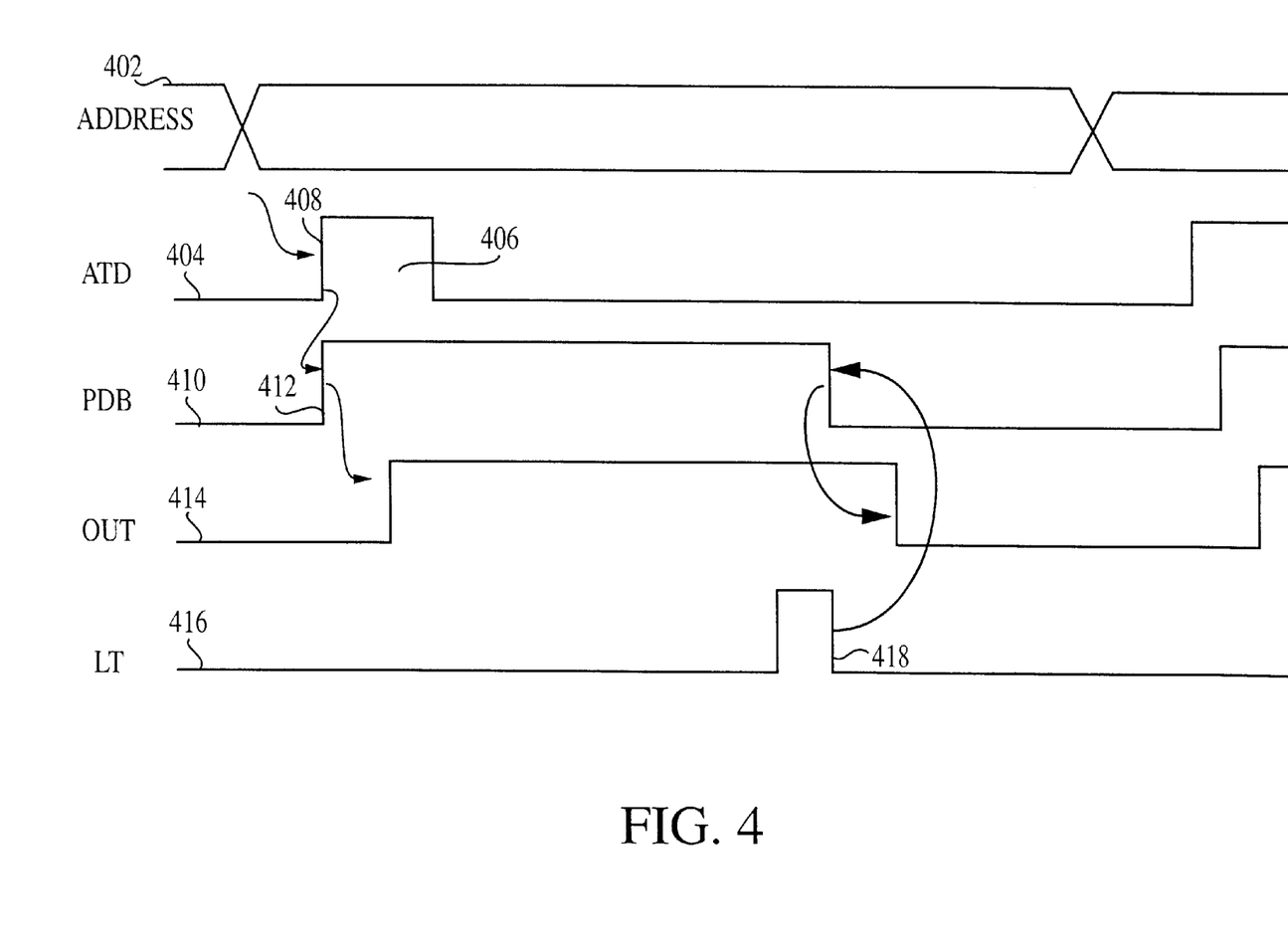
FIG. 4 is a timing diagram illustrating operation of the CAM circuit of FIG. 2.

FIG. 4 is a timing diagram illustrating operation of the CAM circuit 200 in a flash memory chip. In the timing diagram, address input signals received at the address input buffers 104 (FIG. 1) change relatively randomly. These are signals provided to the flash memory chip 100 from external to the chip 100. In response to a transition on any of the address input signals, an address transition detection (ATD) signal 404 is generated. As illustrated in FIG. 4, the ATD signal 404 generally has a low level. After detection of a transition on one of the address signals 402, a positive pulse 406 is generated on the ATD signal. In one embodiment, the pulse 406 has a predetermined time duration.

In the illustrated embodiment, at a time after the rising edge 408 of the ATD signal, the power down signal 410 goes high, as the chip 100 moves from standby to active mode. In the standby mode, circuits are placed in a low power condition to minimize current drain and power dissipation. In the active mode, as controlled by the power down signal 410, those same circuits become active to respond to the change on the address signal. For example, in response to the changed address input, address decoders must become active in order to decode properly the input address. Similarly in active mode, the sense amplifiers must become active to sense the state of the data stored in the selected memory cells and to latch the sensed data.

In response to the rising edge 412 of the power down signal 410, the transistor 204 (FIG. 2) turns on, allowing current to flow in the circuit leg including transistor 206, transistor 204, and transistor 222. If the CAM cell 202 is unprogrammed, current will flow and the node N1 will be pulled down. After inversion by inverter 208, the output signal 414 at the output node 240 goes high.

Subsequently, after a predetermined time period as illustrated in FIG. 4, a latch (LT) signal 416 is generated. In the flash memory chip 100 (FIG. 1), the latch signal 416 may be used to latch the sensed data at the output of the read sense amplifier 174. The falling edge 418 of the LT signal 416 resets the power down signal 410 to its standby mode state. The falling edge on the power down signal 410 turns off the transistor 204 in FIG. 2 and the output signal 414 at node 240 again goes low. In other embodiments, other logic and timing dependencies may be used to control the interaction between the LT signal 416 and the power down signal 410.

This transitioning of the output signal 414 upon every switch from standby to active mode changes the operation mode of the entire flash memory chip 100. This creates additional power consumption. Each transition on a node causes current to flow as the CMOS gate switches. This additional current drain is inconsistent with placing the device in a low power standby mode. Further, the unintended mode switches may interfere with proper timing of the flash memory device. For example, if one or more circuits of the device is in the wrong mode during standby, additional time may be required to switch to the correct mode upon the transition from standby to active mode. This additional time may increase key operational parameters of the flash memory chip 100, such as the read access time.

Figure 5:
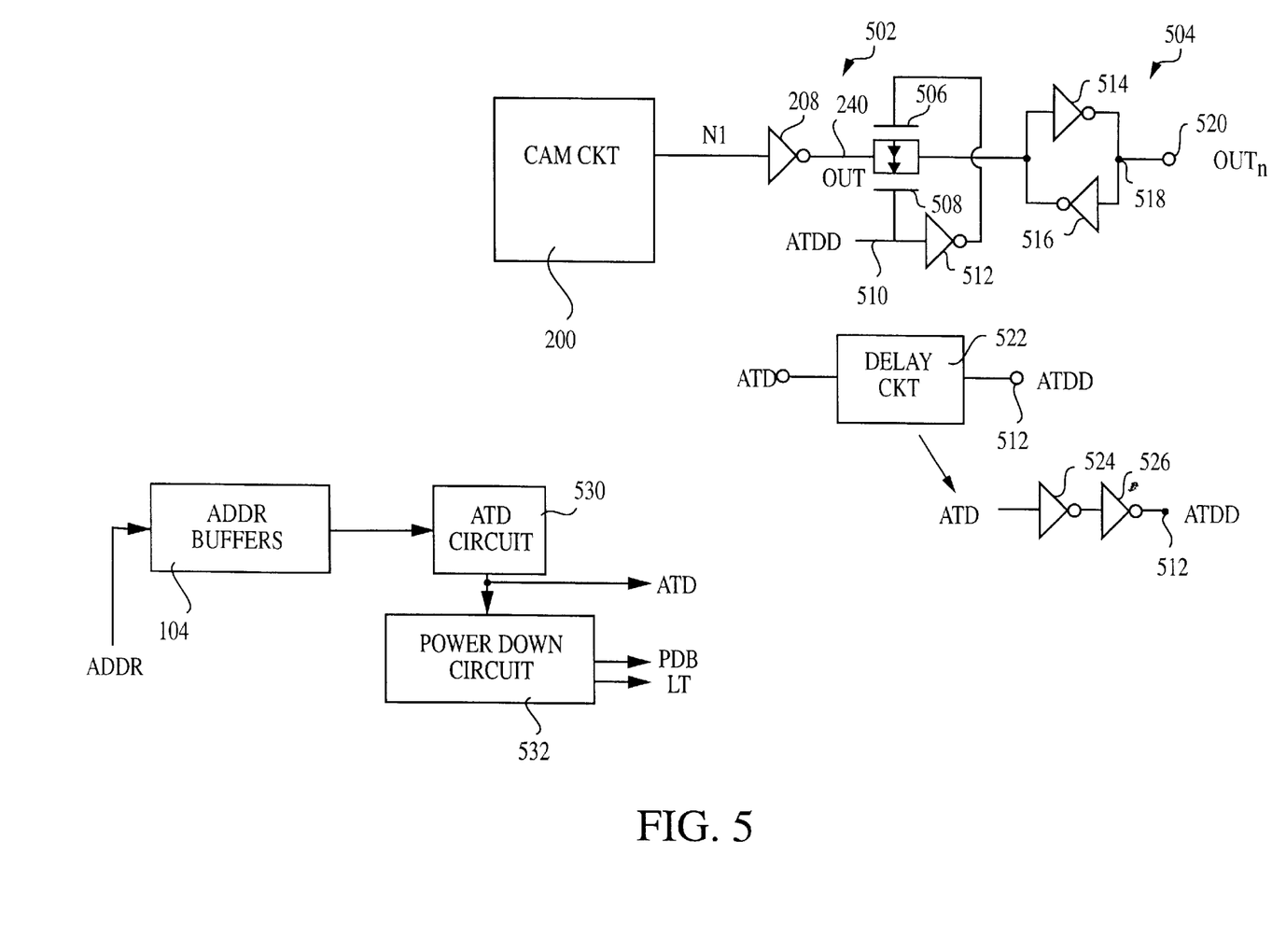
FIG. 5 is a portion of the flash memory chip of FIG. 1 including a content addressable memory (CAM) circuit for storing operational and timing data in the flash memory chip.

FIG. 5 is a portion of the flash memory chip of FIG. 1 including a content addressable memory (CAM) circuit 200 for storing operational and timing data in the flash memory chip 100. In FIG. 5, the CAM circuit 200 has been supplemented with a CMOS transfer gate 502 and a latch 504. The CMOS transfer gate 502 includes a p-channel transistor 506 and an n-channel transistor 508 connected in the conventional manner for a CMOS transfer gate. The gate of the n-channel transistor 508 is driven by a delayed address transition detect (ATDD) signal 510. The ATDD signal 510 is inverted in an inverter 512 to produce an inverted signal which drives the gate of the p-channel transistor 506. The latch 504 includes a first inverter 514 and a second inverter 516. The two inverters 514, 516 are cross-coupled to provide data storage in the manner known in the art. The latch 504 has an output 518 coupled to an output node 520 labeled OUTN in FIG. 5.

For generating the delayed address transition detection signal 510, a delay circuit 522 is included. Any suitable delay circuit may be provided to perform this function. In the embodiment of FIG. 5, the delay circuit 522 includes a first inverter 524 and a series-coupled second inverter 526. Other delay circuits may be substituted as well.

FIG. 5 further illustrates the circuitry necessary to generate signals required by the CAM circuit 200. The address buffers 104 provide input address signals to an address transition detection (ATD) circuit 530. The ATD circuit 530 generates the ATD signal. The ATD signal is provided to the delay circuit 522 for generation of the ATDD signal 512. The ATD signal is also provided to a power down circuit 532. In response to the ATD signal, the power down circuit 532 generates the power down signal, labeled PDB in FIG. 5 and that latch signal, labeled LT in FIG. 5. Design of a suitable ATD circuit 530 and power down circuit 532 are within the purview of those ordinarily skilled in the art.

The circuit of FIG. 5 avoids the problem associated with the CAM circuit 200 of FIG. 2 described above. The circuit of FIG. 5 includes latching the output of the CAM circuit 200 under control of the ATD signal. In this way, the output mode signal on the node 240 does not have to switch back to low when the flash memory chip returns to standby mode.

Figure 6:
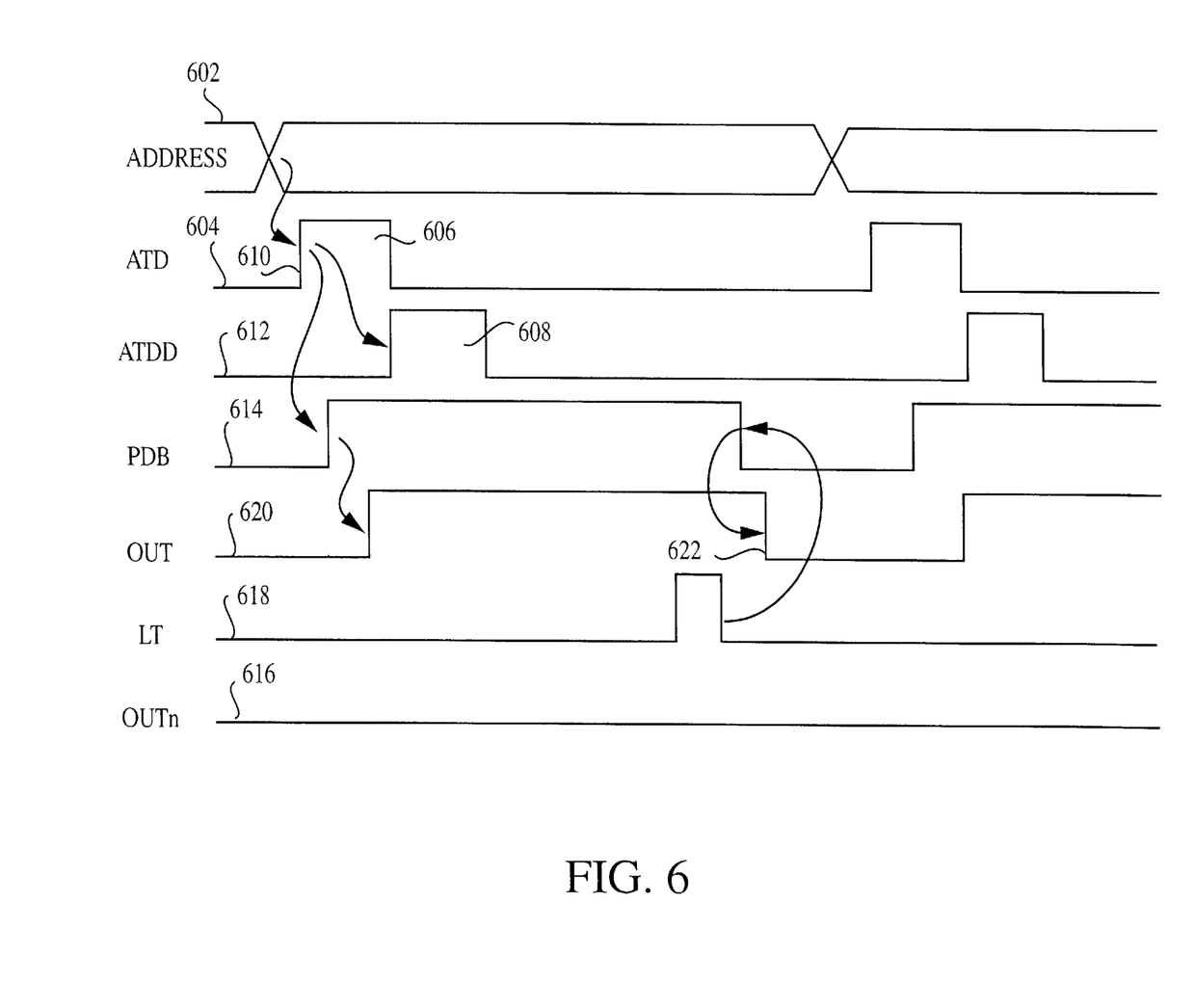
FIG. 6 is a timing diagram illustrating operation of the CAM circuit of FIG. 5.

Operation of the circuit of FIG. 5 is illustrated in FIG. 6. In FIG. 6, an input address signal 602 is received at the address buffers 104. After buffering, the input address signal 602 is provided to the ATD circuit 530 (FIG. 5). In response to a transition on the input address signal 602, a pulse 606 having a predetermined duration is generated on the ATD signal 604. A matching pulse 608 is generated on the ATDD signal 612, since the ATDD signal 612 is a delayed version of the ATD signal 604. The rising edge 610 of the ATD pulse 606 causes the power down circuit 532 to generate the power down signal 614. In response to the change in state of the power down signal 614, the output signal on the node 240 from the CAM circuit 200 goes high. However, this transition is not reflected in the output signal OUTN 616 at the node 520. The output signal OUTN remains unchanged, as illustrated in FIG. 6. Thus, the internal mode of the flash memory chip 100 does not change, and CMOS circuits are not gated. This reduces timing delays and internal current drain associated with the prior art CAM circuit.

After completion of an operation, such as a sensing operation in the sense amplifiers 174, the latch (LT) signal 618 is generated and the data are latched on the falling edge of the latch signal 618. In response, the power down signal 614 transitions to its low or standby state. Since the power down signal 614 goes low, the output signal (OUT) 620 on the node 240 goes low at a falling edge 622. Again, this transition is not reflected in the output signal 516, labeled OUTN.

Thus, in FIG. 6, the ATDD signal 612 goes high while the output signal on the node 240 is high and the ATDD signal 612 goes low while the output signal on the node 240 is still high. Thus the new output OUTN, signal 616 can stay high and does not create internal node switching and additional power consumption. These benefits are obtained by adding minimal circuitry and minimal current drain.

From the foregoing, it can be seen that the present invention provides an improved data storage circuit which stores operational mode and timing information in a circuit such as a flash memory chip. The output of the data storage circuit, such as a CAM circuit, is latched during power down operations to prevent unwanted mode changes or current flow in other portions of the flash memory chip. A preexisting address transition detection signal is used to control the added latch. Thus, the relative cost in terms of additional circuitry and power drain is very small compared to the benefits obtained.

It is to be noted that suitable transistor sizes specifying channel width to length ratios (measured in micrometers or microns) for the transistors which make up the depicted circuit have been omitted from the figures. It will be appreciated that suitable ratios may be chosen depending on the design requirements and the capabilities and limitations of the particular integrated circuit fabrication process used for implementation of the circuit as well as the performance requirements of the specific embodiment.

It is therefore intended that the foregoing detailed description be regarded as illustrative rather than limiting. Alterations may be made, such as substituting alternative circuit technologies and topologies while retaining the required functionality and features of the illustrated circuits. It is to be further understood that it is the following claims, including all equivalents, that are intended to define the spirit and scope of this invention.

We claim:

1. A memory comprising:
   a data storage circuit;
   a first switch coupled to the data storage circuit and responsive to a power down signal, the power down signal having an active state and a standby state;
   an output configured to provide a data state of the data storage circuit; (and)
   a second switch coupled to the output and responsive to an activity signal; and
   a latch coupled to the second switch and configured to store a state of the data storage circuit the latch having a latch output which provides the state of the data storage circuit when but which does not change state when the power down signal has the standby state to prevent unwanted mode changes and power dissipation in the memory.

2. The memory of claim 1 further comprising:
   an address transition circuit responsive to input address signals received at the memory to produce an address transition detection signal as the activity signal; and
   a power down circuit coupled to the address transition circuit and configured to produce the power down signal in response to the address transition signal.

3. The memory of claim 1 wherein the data storage circuit comprises: a content addressable memory (CAM) circuit.

4. The memory of claim 3 further comprising:
   a bias circuit coupled to the output, the first switch interrupting current in the bias circuit and the data storage circuit when the power down signal has the standby state.

5. The memory of claim 2 wherein the second switch comprises a transfer gate responsive to the address transition detection signal to couple the output to the latch.

6. A method for controlling operation of a memory, the method comprising the acts of:

storing data in a data storage circuit, the data indicative of an operating parameter of the memory;

providing a data state of the data storage circuit at an output;

detecting address input signals of the memory;

in response to absence of address transitions, placing the data storage circuit in a low power state; and in response to absence of address transitions, latching the data state for use by other circuits of the memory.

7. The method of claim 6 wherein the act of storing data in a data storage circuit comprises the act of:

programming a content address memory cell.

8. The method of claim 6 further comprising the step of:

in response to the absence of address transitions, generating an address transition detection signal.

9. The method of claim 8 wherein the act of placing the data storage circuit in a low power state comprises the act of:

generating a power down signal in response to the address transition detection signal; and interrupting a current in the data storage circuit in response to the power down signal.

10. The method of claim 8 wherein the act of latching the data state comprises:

delaying he address transition detection signal to produce a delayed address transition detection signal; and latching the data state at the output using the delayed address transition detection signal.

11. A flash memory control circuit comprising:

an address transition detection circuit to generate an address transition detection (ATD) signal;

a content addressable memory (CAM) cell;

an output coupled to the CAM cell to provide a data state of the CAM cell;

a bias transistor coupled to the output;

a switching transistor responsive to a power down signal to isolate the CAM cell from the output, the power down signal being generated in response to the ATD signal;

a latch configured to store the data state of the CAM cell;

a switch responsive to the ATD signal for coupling the output to an input of the latch; and an ATD delay circuit coupled to the address transition detection circuit and the switch, the ATD delay circuit delaying the ATD signal and producing a delayed ATD signal for controlling the switch.

* * * * *